(12) United States Patent
Nakajima et al.

(10) Patent No.: US 10,770,341 B2
(45) Date of Patent: Sep. 8, 2020

(54) METHOD FOR MANUFACTURING SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Takahito Nakajima, Oita Oita (JP); Shinya Ito, Oita Oita (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/137,823

(22) Filed: Sep. 21, 2018

(65) Prior Publication Data

US 2019/0295882 A1    Sep. 26, 2019

(30) Foreign Application Priority Data

Mar. 23, 2018   (JP) ................ 2018-055448

(51) Int. Cl.
*H01L 21/02*   (2006.01)
*H01L 21/762*   (2006.01)
(Continued)

(52) U.S. Cl.
CPC .... *H01L 21/76224* (2013.01); *H01L 21/0217* (2013.01); *H01L 21/02164* (2013.01); *H01L 21/02208* (2013.01); *H01L 21/02271* (2013.01); *H01L 21/02274* (2013.01); *H01L 21/02337* (2013.01); *H01L 21/3065* (2013.01); *H01L 21/3081* (2013.01); *H01L 21/3086* (2013.01); *H01L 21/31053* (2013.01); *H01L 21/31111* (2013.01); *H01L 21/31116* (2013.01); *H01L 21/823481* (2013.01);
(Continued)

(58) Field of Classification Search
CPC ......... H01L 21/31053; H01L 21/76224; H01L 21/30625; H01L 21/76229; H01L 27/14689; H01L 21/70
See application file for complete search history.

(56) References Cited

U.S. PATENT DOCUMENTS 7,091,105 B2   8/2006 Lee
2002/0127818 A1*   9/2002 Lee .................. H01L 21/76224
                                                438/424
(Continued)

FOREIGN PATENT DOCUMENTS

JP        4497860 B2    7/2010
JP     2011-216589 A   10/2011

*Primary Examiner* — Jaehwan Oh
(74) *Attorney, Agent, or Firm* — White & Case LLP

(57) ABSTRACT

A method for manufacturing a semiconductor device according to an embodiment includes forming a first insulating film on a semiconductor substrate, the first insulating film being patterned; forming a trench in the semiconductor substrate using the first insulating film as a mask; depositing a second insulating film in the trench and on the first insulating film; removing the second insulating film on the first insulating film using a CMP method; removing a portion of the first insulating film; removing a portion of the second insulating film using isotropic etching; and removing a remaining portion of the first insulating film.

4 Claims, 25 Drawing Sheets

(51) Int. Cl.
*H01L 21/308* (2006.01)
*H01L 21/3105* (2006.01)
*H01L 21/311* (2006.01)
*H01L 21/3065* (2006.01)
*H01L 21/8234* (2006.01)
*H01L 21/3213* (2006.01)
*H01L 21/285* (2006.01)

(52) U.S. Cl.
CPC .. *H01L 21/28556* (2013.01); *H01L 21/32136* (2013.01); *H01L 21/823437* (2013.01); *H01L 21/823462* (2013.01)

(56) References Cited

U.S. PATENT DOCUMENTS

| | | | |
|---|---|---|---|
| 2009/0212387 A1* | 8/2009 | Ito | H01L 21/823481 257/506 |
| 2012/0190167 A1* | 7/2012 | Huang | H01L 21/76229 438/400 |
| 2016/0118293 A1* | 4/2016 | Sato | H01L 21/0217 257/506 |
| 2016/0365272 A1* | 12/2016 | Sato | H01L 21/31055 |

* cited by examiner

US 10,770,341 B2

METHOD FOR MANUFACTURING SEMICONDUCTOR DEVICE

CROSS-REFERENCE TO RELATED APPLICATION

This application is based upon and claims the benefit of priority from Japanese Patent Application No. 2018-055448, filed on Mar. 23, 2018, the entire contents of which are incorporated herein by reference.

FIELD

Embodiments described herein relate generally to methods for manufacturing a semiconductor device.

BACKGROUND

A device isolation region is formed in order to electrically separate devices formed on a semiconductor substrate. An example of the device isolation region is a shallow trench isolation (STI) structure in which a trench formed in a semiconductor substrate is filled with an insulating film. In a case wires are patterned on the STI structure, an etching residue may be generated in an end portion of the STI structure, which causes, for example, a short circuit between the wires.

DETAILED DESCRIPTION

Figure 1:
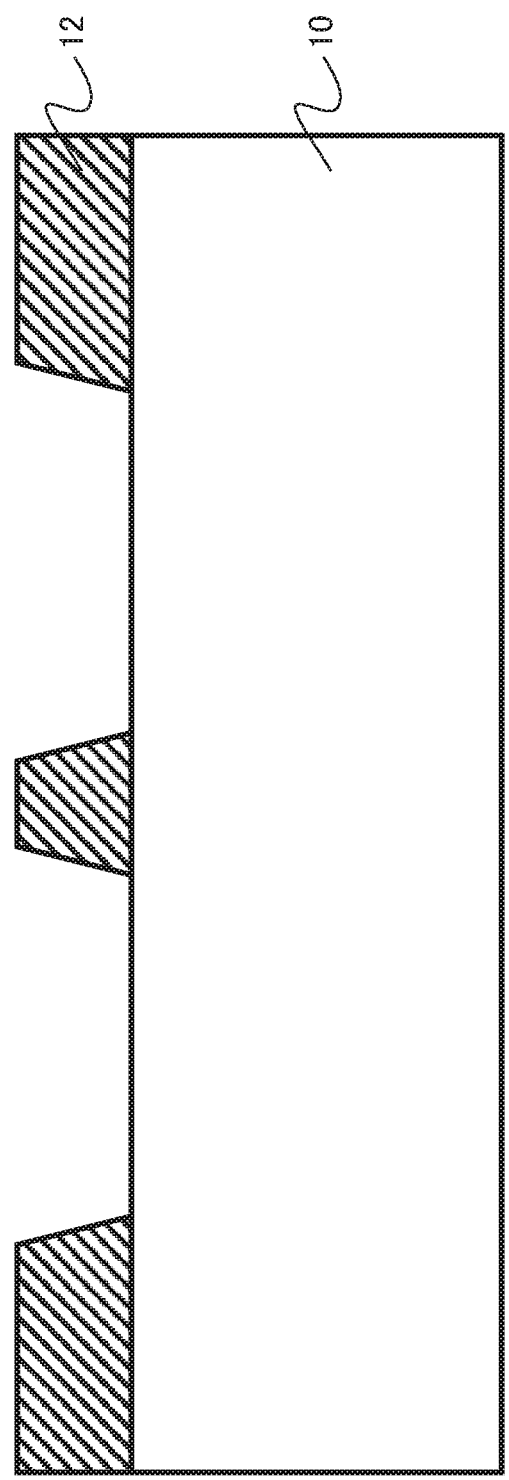
FIG. 1 is a cross-sectional view schematically illustrating a method for manufacturing a semiconductor device according to a first embodiment.

A method for manufacturing a semiconductor device according to an aspect of the invention includes: forming a first insulating film on a semiconductor substrate, the first insulating film being patterned; forming a trench in the semiconductor substrate using the first insulating film as a mask; depositing a second insulating film in the trench and on the first insulating film; removing the second insulating film on the first insulating film using a CMP method; removing a portion of the first insulating film; removing a portion of the second insulating film using isotropic etching; and removing a remaining portion of the first insulating film.

In the specification, in some cases, the same or similar members are denoted by the sane reference numerals and the description thereof will not be repeated.

In the specification, in some cases, in order to show the positional relationship between, for example, components, the upper direction in the drawings is described as an "upper side" and the lower direction in the drawings is described as a "lower side". In the specification, the terms "upper side" and "lower side" do not necessarily indicate the relationship with the direction of gravity.

First Embodiment

A method for manufacturing a semiconductor device according to a first embodiment includes: forming a first insulating film on a semiconductor substrate, the first insulating film being patterned; forming a trench in the semiconductor substrate using the first insulating film as a mask; depositing a second insulating film in the trench and on the first insulating film; removing the second insulating film on the first insulating film using a CMP method; removing a portion of the first insulating film; removing a portion of the second insulating film using isotropic etching; and removing a remaining portion of the first insulating film.

The method for manufacturing a semiconductor device according to the first embodiment is a method for manufacturing a semiconductor device including an device isolation region with an STI structure. Hereinafter, a case in which isotropic etching is wet etching will be described as an example.

FIG. 1, FIG. 2, FIG. 3, FIG. 4, FIG. 5, FIG. 6, FIG. 7, FIG. 8, FIG. 9, and FIG. 10 are cross-sectional views schematically illustrating the method for manufacturing a semiconductor device according to the first embodiment.

First, a single-crystal silicon substrate 10 is prepared. The single-crystal silicon substrate 10 is an example of a semiconductor substrate.

Then, a silicon nitride film 12 is deposited on a surface of the single-crystal silicon substrate 10. The silicon nitride film 12 is an example of a first insulating film.

The silicon nitride film 12 is deposited by, for example, a chemical vapor deposition (CVD) method. The thickness of the silicon nitride film 12 is, for example, equal to or greater than 100 nm and equal to or less than 1000 nm.

Then, the silicon nitride film 12 is patterned (FIG. 1). The silicon nitride film 12 is patterned by, for example, a lithography method and a reactive ion etching (RIE) method.

Figure 2:
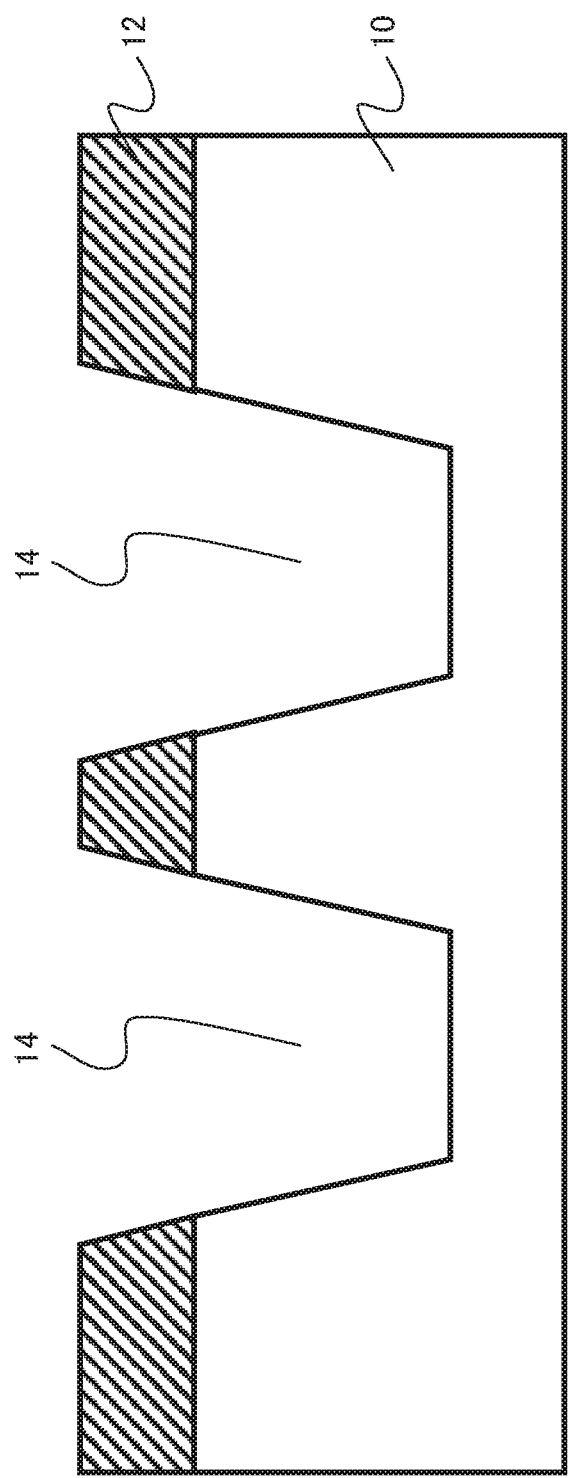
FIG. 2 is a cross-sectional view schematically illustrating the method for manufacturing a semiconductor device according to the first embodiment.

Then, a trench 14 is formed in the single-crystal silicon substrate 10 using the patterned silicon nitride film 12 as a mask (FIG. 2). The trench 14 is formed by, for example, the RIE method. The depth of the trench 14 is, for example, equal to or greater than 1 μm and equal to or less than 2 μm.

Figure 3:
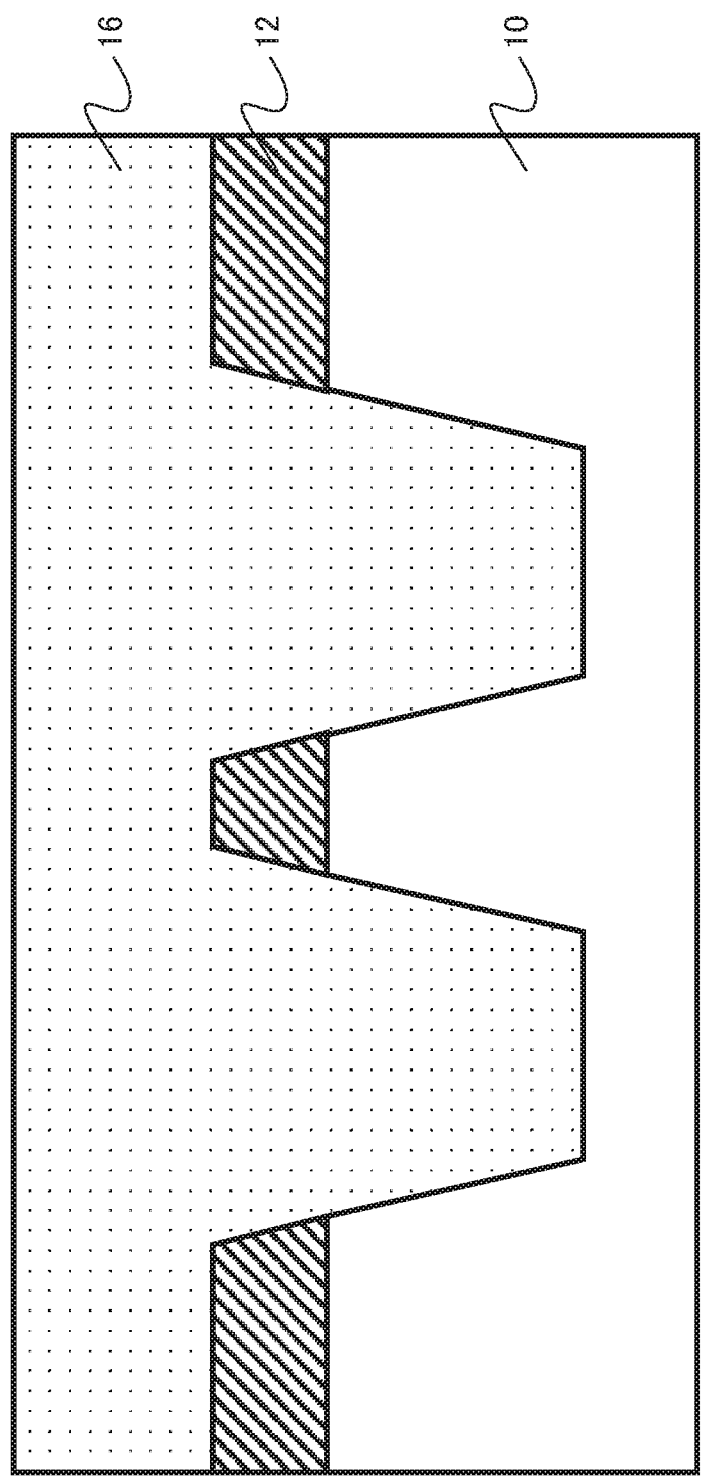
FIG. 3 is a cross-sectional view schematically illustrating the method for manufacturing a semiconductor device according to the first embodiment.

Then, a silicon oxide film 16 is deposited in the trench 14 and on the silicon nitride film 12 (FIG. 3). The silicon oxide film 16 is an example of a second insulating film. The silicon oxide film 16 is deposited by, for example, a high density plasma (HDP)-CVD method.

Figure 4:
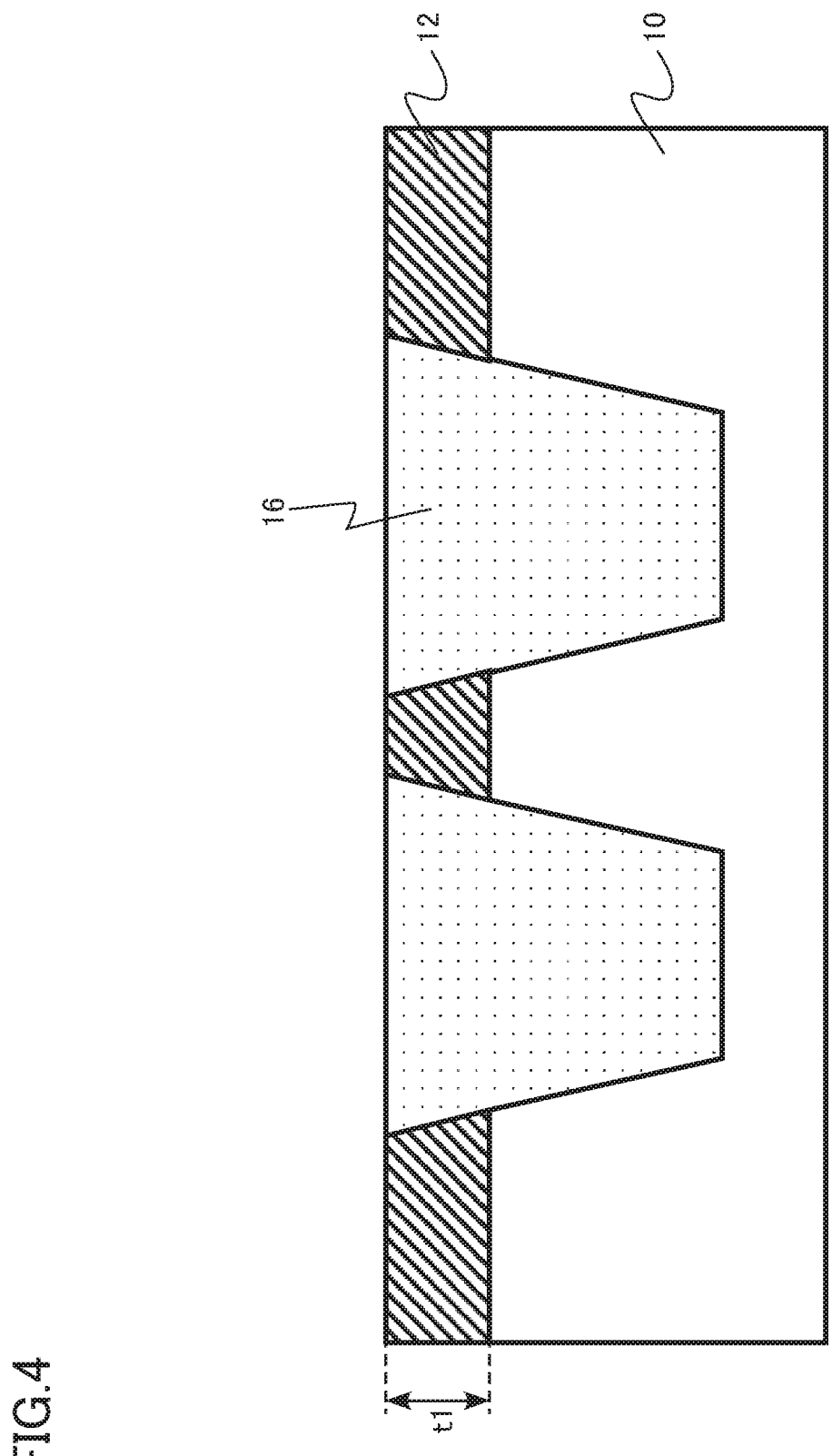
FIG. 4 is a cross-sectional view schematically illustrating the method for manufacturing a semiconductor device according to the first embodiment.

Then, the silicon oxide film 16 on the silicon nitride film 12 is removed by a chemical mechanical polishing (CMP) method (FIG. 4). The surface of the silicon oxide film 16 is planarized.

Then, an annealing process is performed. The silicon oxide film 16 is densified by the annealing process. For example, the annealing process is performed in an inert gas atmosphere at a temperature that is equal to or greater than 800° C. and equal to or less than 1200° C.

Figure 5:
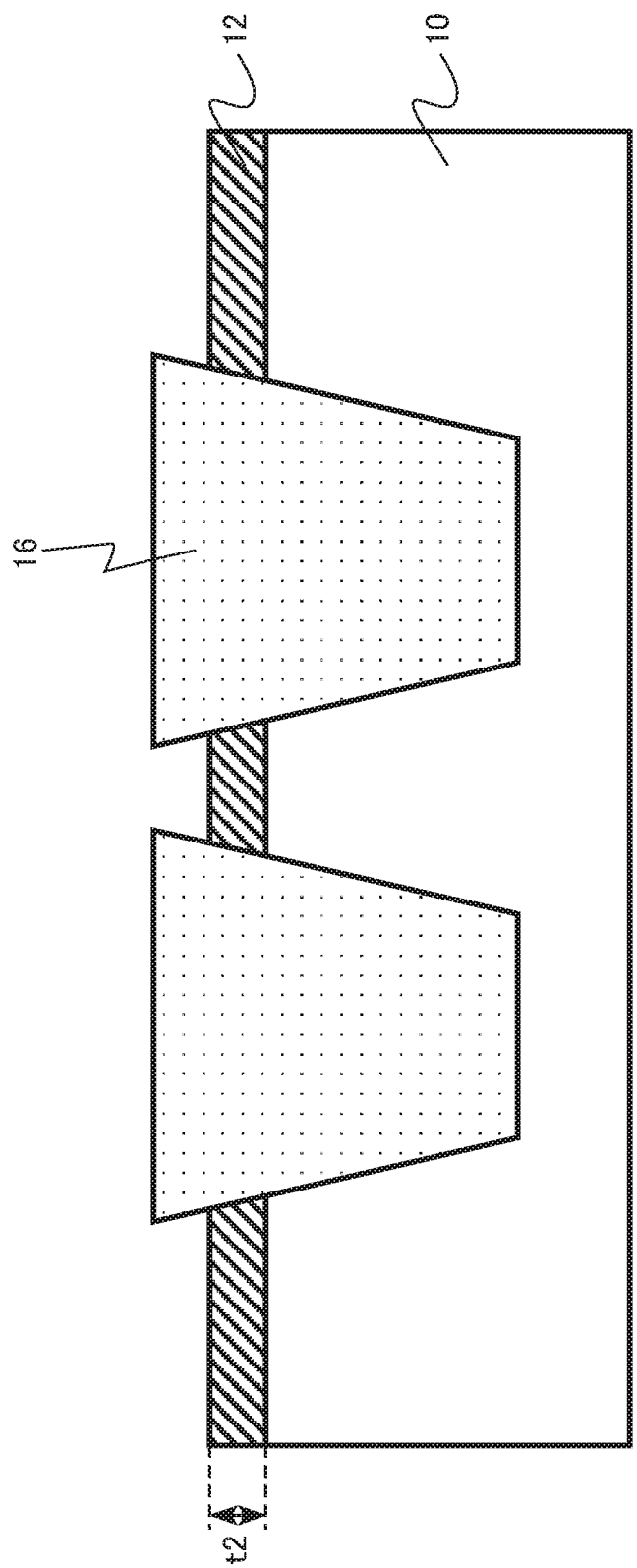
FIG. 5 is a cross-sectional view schematically illustrating the method for manufacturing a semiconductor device according to the first embodiment.

Then, a portion of the silicon nitride film 12 is removed (FIG. 5). The silicon nitride film 12 is etched by, for example, wet etching. The wet etching is performed using, for example, thermal phosphoric acid.

In a case in which a portion of the silicon nitride film 12 is removed, a portion of the silicon nitride film 12 that is equal to or greater than half of the thickness (t1 in FIG. 4) of the silicon nitride film 12 and is equal to or less than three quarters of the thickness remains (t2 in FIG. 5). In other words, a portion of the silicon nitride film 12 that is equal to or greater than a quarter of the thickness t1 of the silicon nitride film 12 and is equal to or less than half of the thickness t1 is etched.

Figure 6:
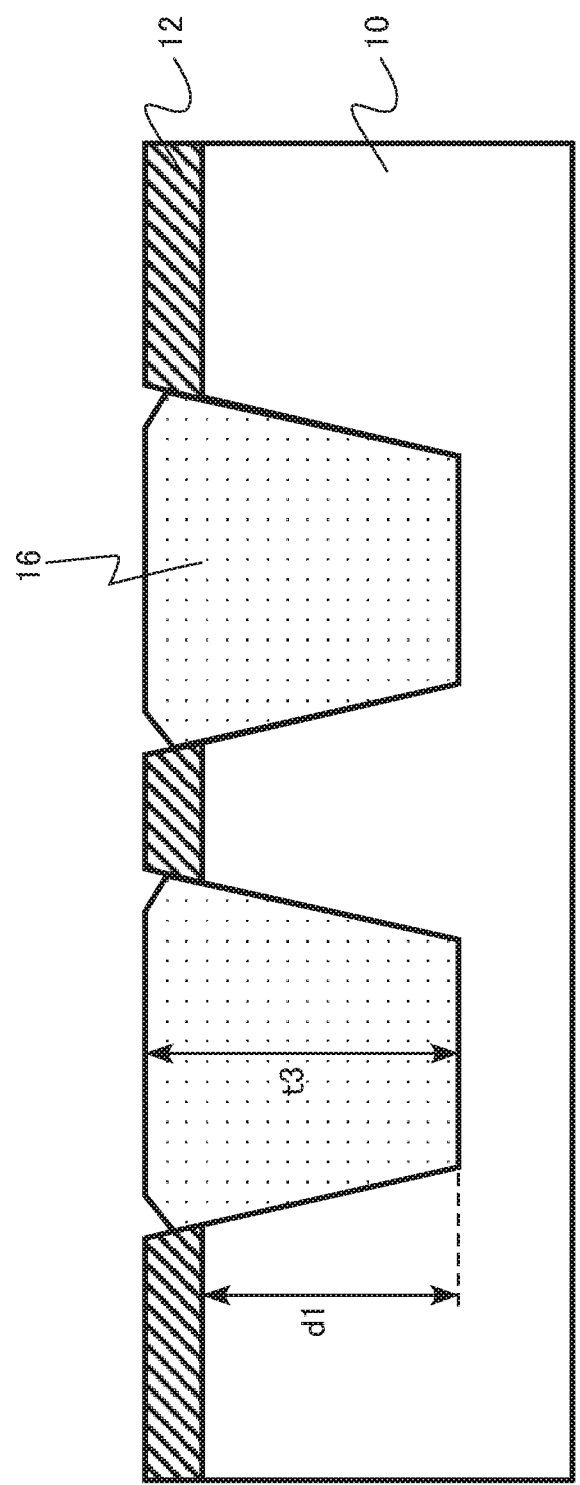
FIG. 6 is a cross-sectional view schematically illustrating the method for manufacturing a semiconductor device according to the first embodiment.

Then, a portion of the silicon oxide film 16 is removed by wet etching (FIG. 6). Hydrofluoric-acid-based chemicals are used for the wet etching. For example, buffered hydrofluoric acid is used as the chemical. The buffered hydrofluoric acid is a mixed solution of hydrofluoric acid and ammonium fluoride.

For example, the amount of etching in the wet etching is adjusted such that the thickness (t3 in FIG. 6) of at least a portion of the silicon oxide film 16 remaining in the trench 14 is greater than the depth (d1 in FIG. 6) of the trench 14. At the time of the wet etching, the wet etching is performed such that a corner portion of the silicon oxide film 16 exposed through the silicon nitride film 12 is rounded.

Figure 7:
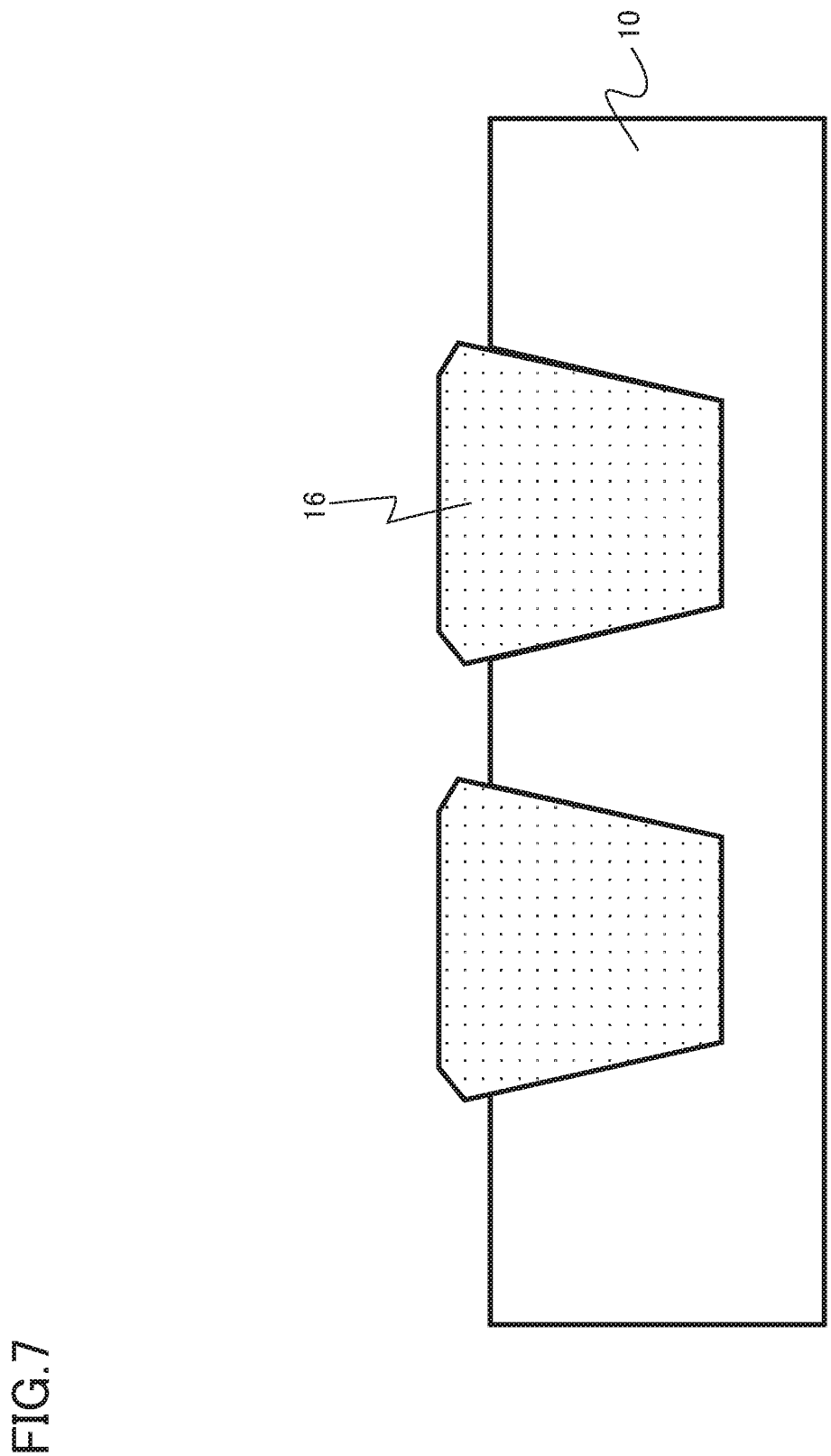
FIG. 7 is a cross-sectional view schematically illustrating the method for manufacturing a semiconductor device according to the first embodiment.

Then, a remaining portion of the silicon nitride film 12 is removed (FIG. 7). The silicon nitride film 12 is etched by, for example, wet etching. For example, thermal phosphoric acid is used for the wet etching.

Figure 8:
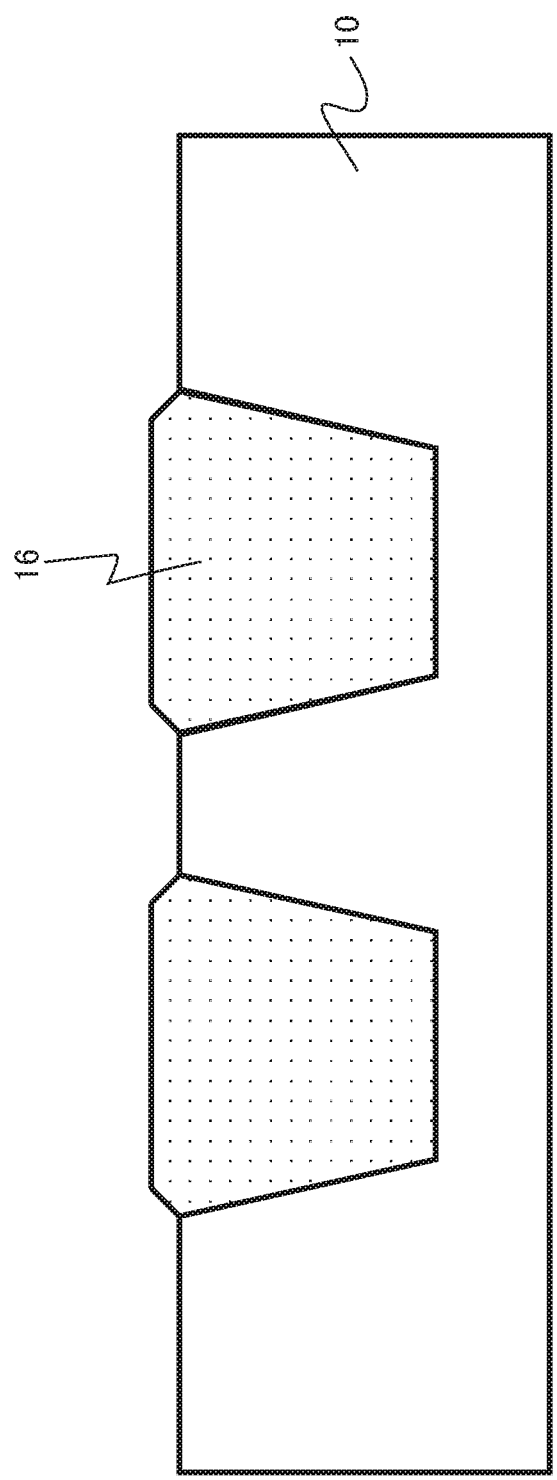
FIG. 8 is a cross-sectional view schematically illustrating the method for manufacturing a semiconductor device according to the first embodiment.

Then, pre-processing for forming a gate oxide film is performed (FIG. 8). The pre-processing is performed by wet etching. Hydrofluoric-acid-based chemicals are used for the wet etching. For example, diluted hydrofluoric acid is used as the chemical. A portion of the silicon oxide film 16 is etched by the pre-processing.

Figure 9:
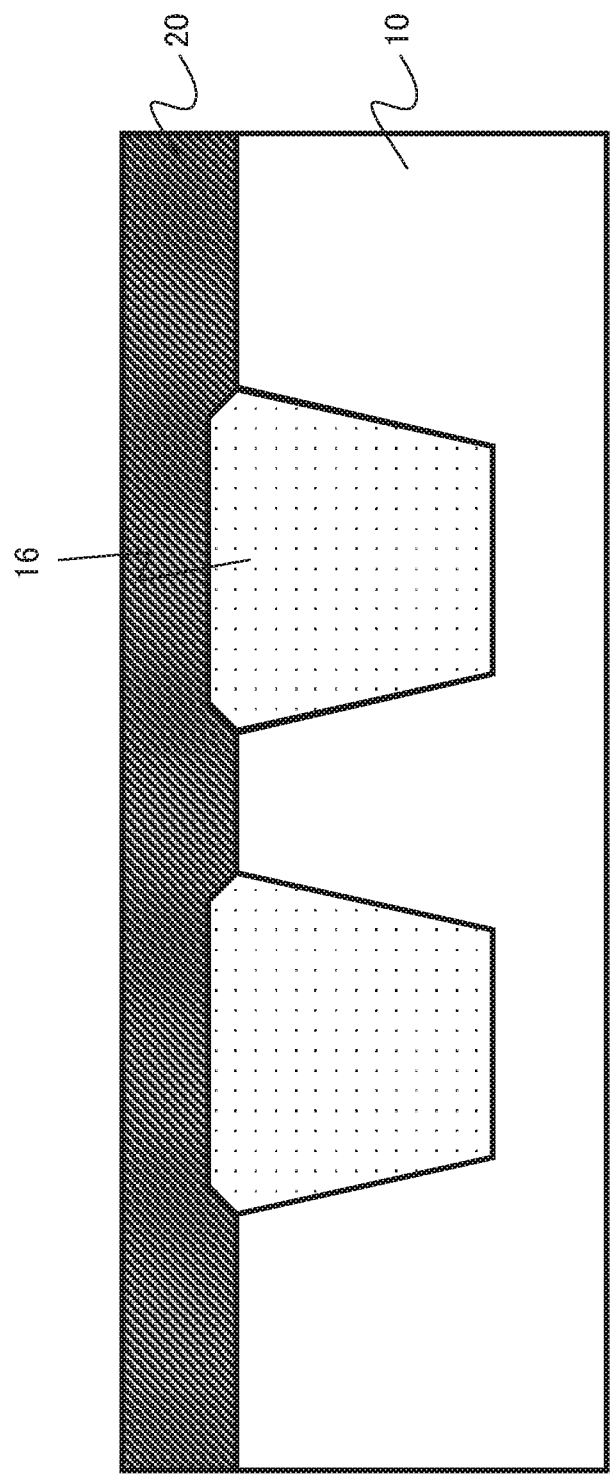
FIG. 9 is a cross-sectional view schematically illustrating the method for manufacturing a semiconductor device according to the first embodiment.

Then, a gate insulating film (not illustrated) is formed on the single-crystal silicon substrate 10. Then, a gate electrode 20 is deposited (FIG. 9). The gate electrode 20 is deposited by, for example, the CVD method. The gate electrode 20 is made of a conductive material. The gate electrode 20 is made of a semiconductor, metal, or a metal compound.

Figure 10:
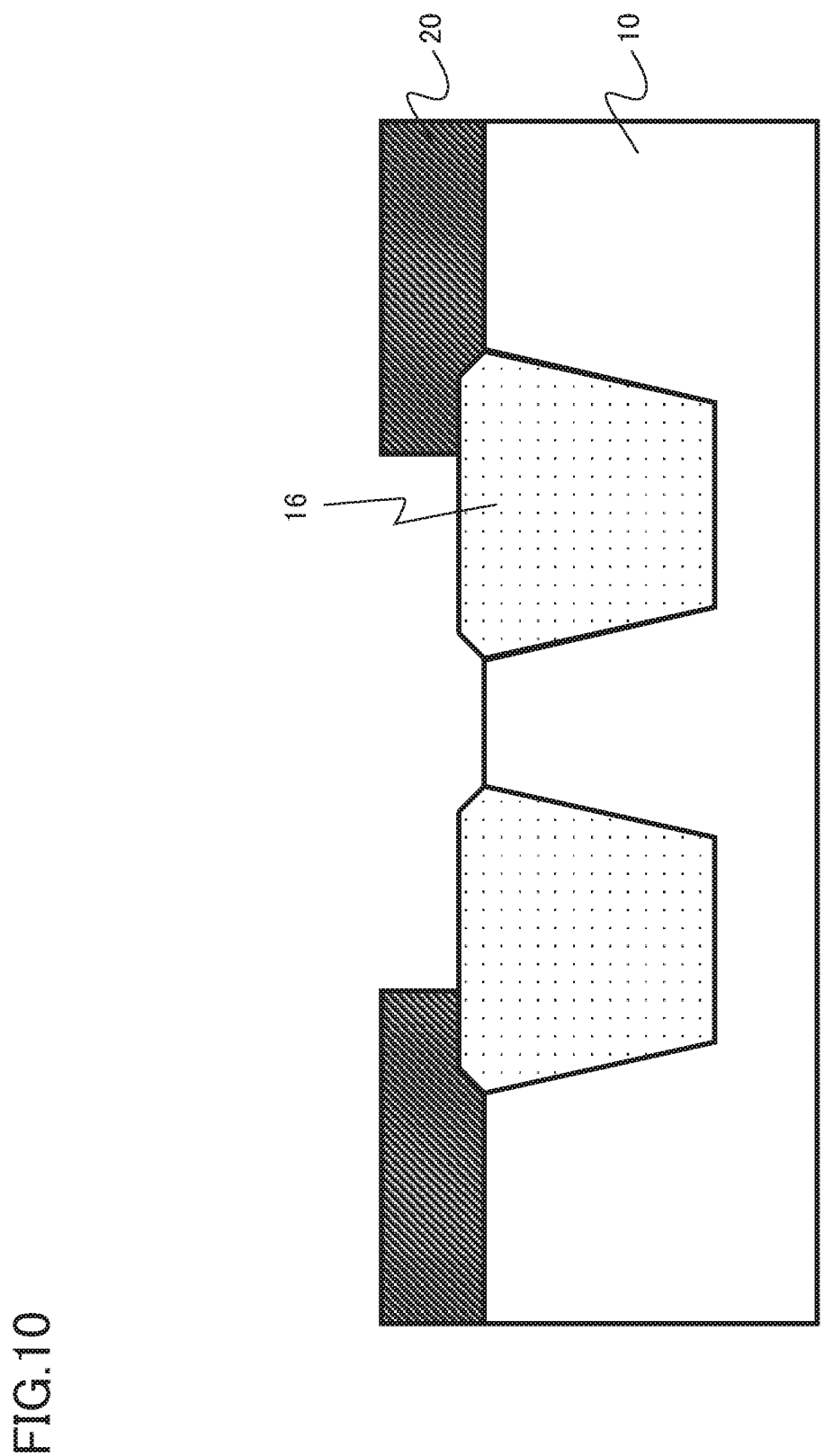
FIG. 10 is a cross-sectional view schematically illustrating the method for manufacturing a semiconductor device according to the first embodiment.

Then, the gate electrode 20 is patterned (FIG. 10). The gate electrode 20 is patterned by, for example, a lithography method and the RIE method.

The semiconductor device in which the gate electrode 20 has been patterned on the STI structure is manufactured by the above-mentioned manufacturing method.

Next, the function and effect of the first embodiment will be described.

In the formation of the gate electrode pattern on the STI structure, an etching residue is likely to be generated when the wire is patterned in an end portion of the STI structure. In a case in which the etching residue is generated, for example, a short circuit occurs between the wires.

FIG. 11, FIG. 12, FIG. 13, FIG. 14, and FIG. 15 are cross-sectional views schematically illustrating a semiconductor device manufacturing method according to a comparative example.

The semiconductor device manufacturing method according to the comparative example differs from the manufacturing method according to the first embodiment in that it does not include the removal of a portion of the first insulating film. Hereinafter, the description of a portion of the same content as that in the manufacturing method according to the first embodiment will not be repeated.

The process from the removal of the silicon oxide film 16 on the silicon nitride film 12 by a CMP method to annealing is the same as that in the first embodiment.

Figure 11:
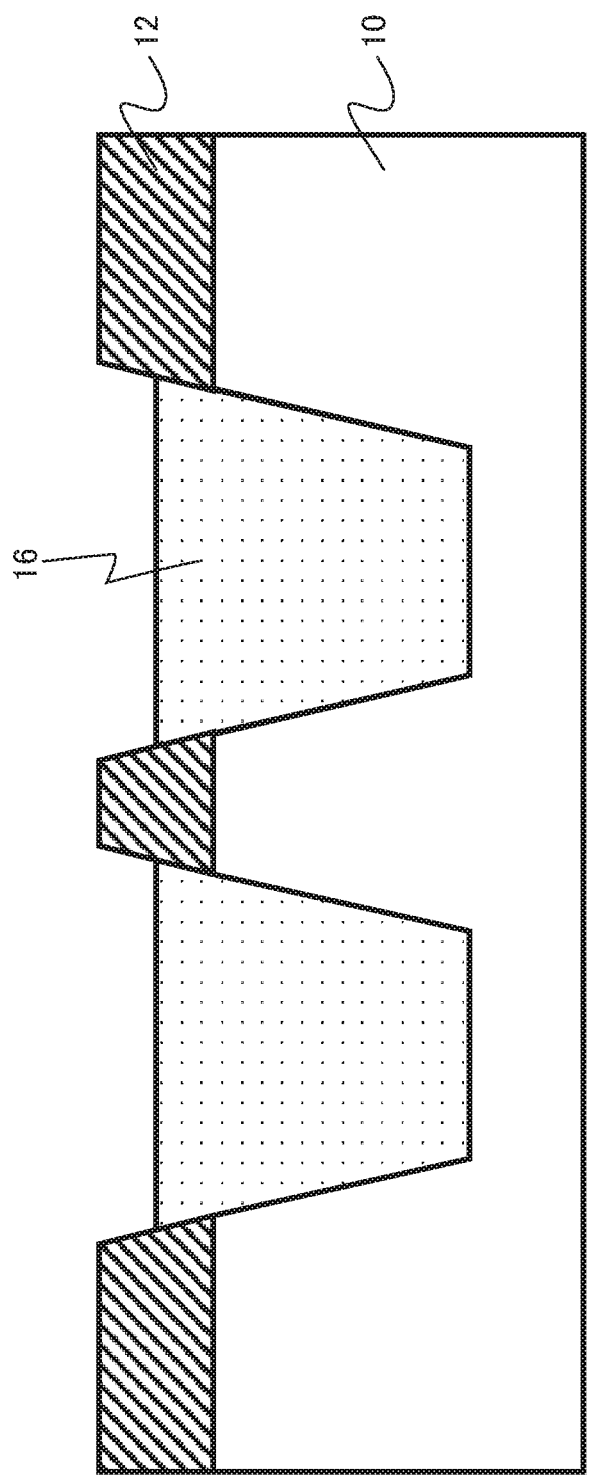
FIG. 11 is a cross-sectional view schematically illustrating a method for manufacturing a semiconductor device according to a comparative example.

Then, a portion of the silicon oxide film 16 is removed by wet etching (FIG. 11). Hydrofluoric-acid-based chemicals are used for the wet etching. For example, buffered hydrofluoric acid is used as the chemical. The buffered hydrofluoric acid is a mixed solution of hydrofluoric acid and ammonium fluoride.

For example, the wet etching is adjusted such that the thickness of at least a portion of the silicon oxide film 16 remaining in the trench 14 is greater than the depth of the trench 14.

Figure 12:
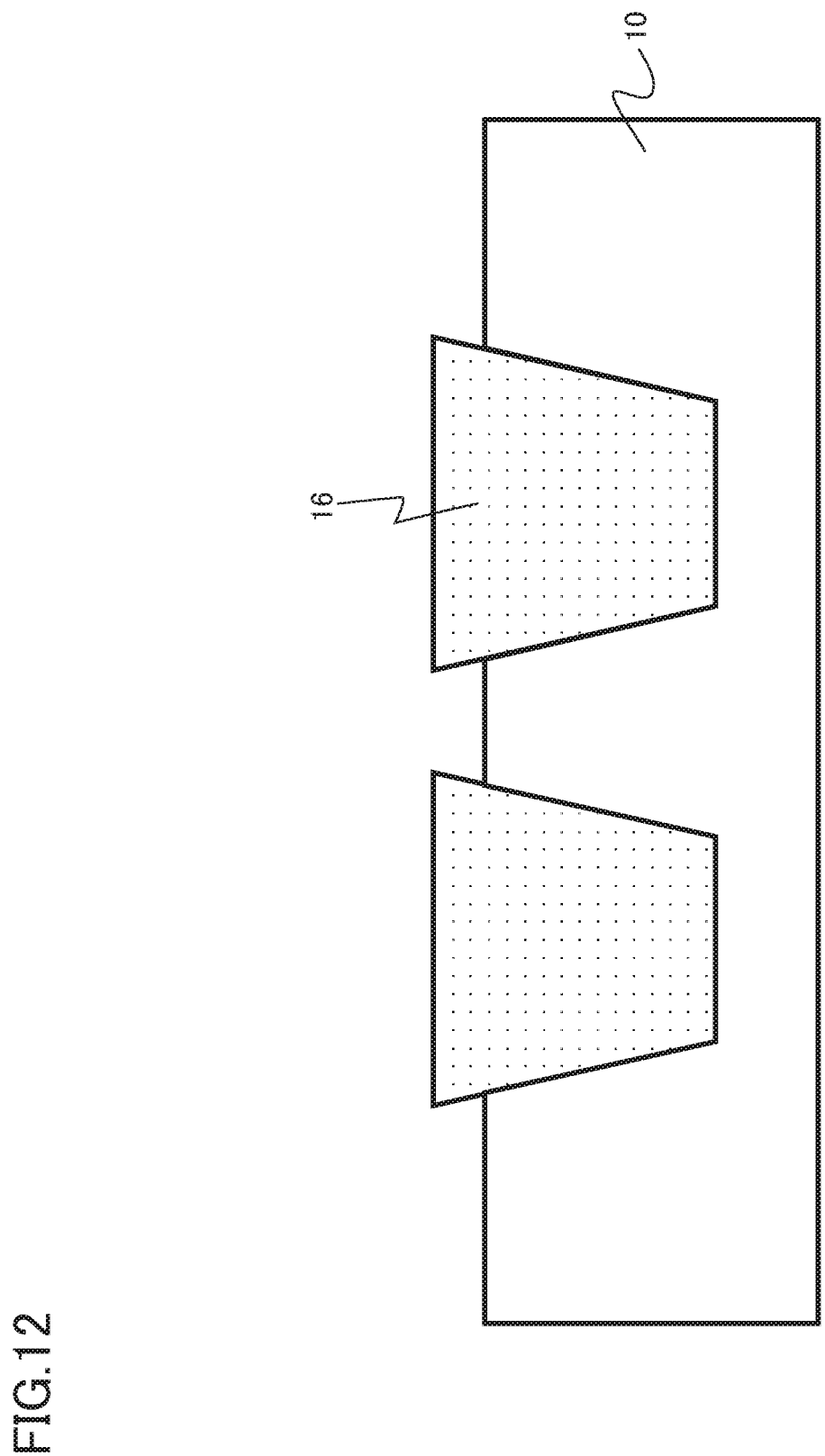
FIG. 12 is a cross-sectional view schematically illustrating the method for manufacturing a semiconductor device according to the comparative example.

Then, the silicon nitride film 12 is removed (FIG. 12). The silicon nitride film 12 is etched by, for example, wet etching. The wet etching is performed using, for example, thermal phosphoric acid.

Figure 13:
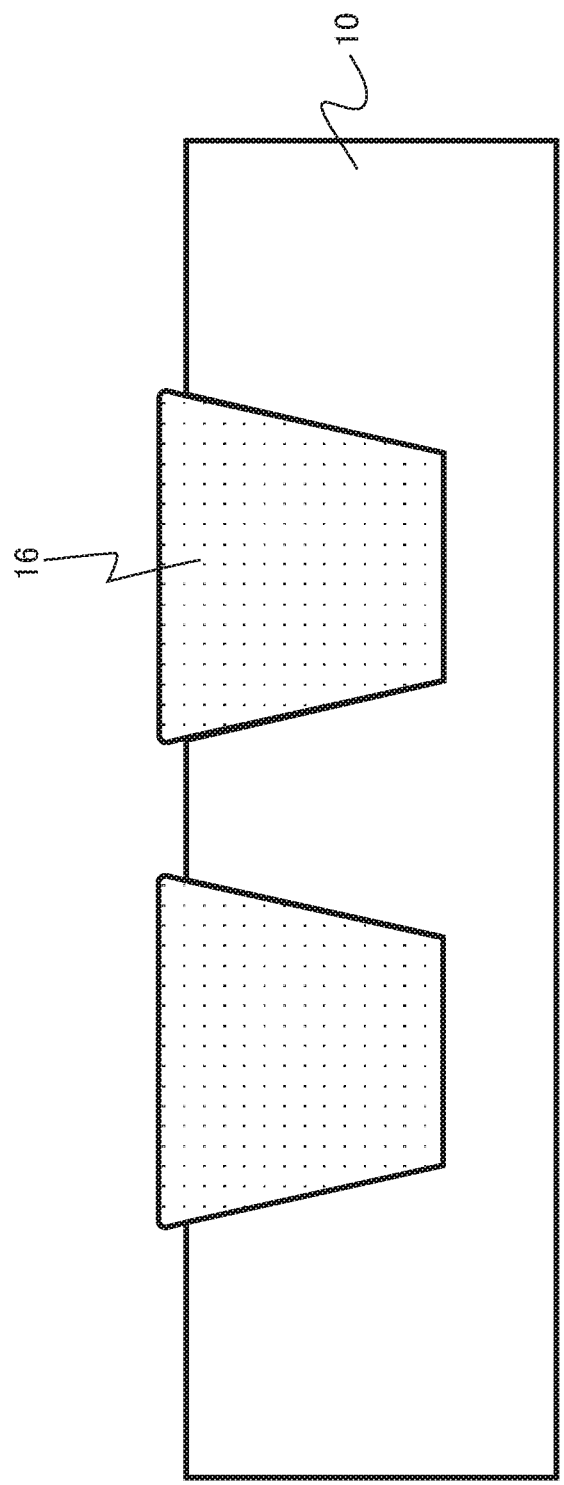
FIG. 13 is a cross-sectional view schematically illustrating the method for manufacturing a semiconductor device according to the comparative example.

Then, pre-processing for forming a gate oxide film is performed (FIG. 13). The pre-processing is performed by wet etching. Hydrofluoric-acid-based chemicals are used for the wet etching. For example, diluted hydrofluoric acid is used as the chemical. A portion of the silicon oxide film 16 is etched by the pre-processing.

Figure 14:
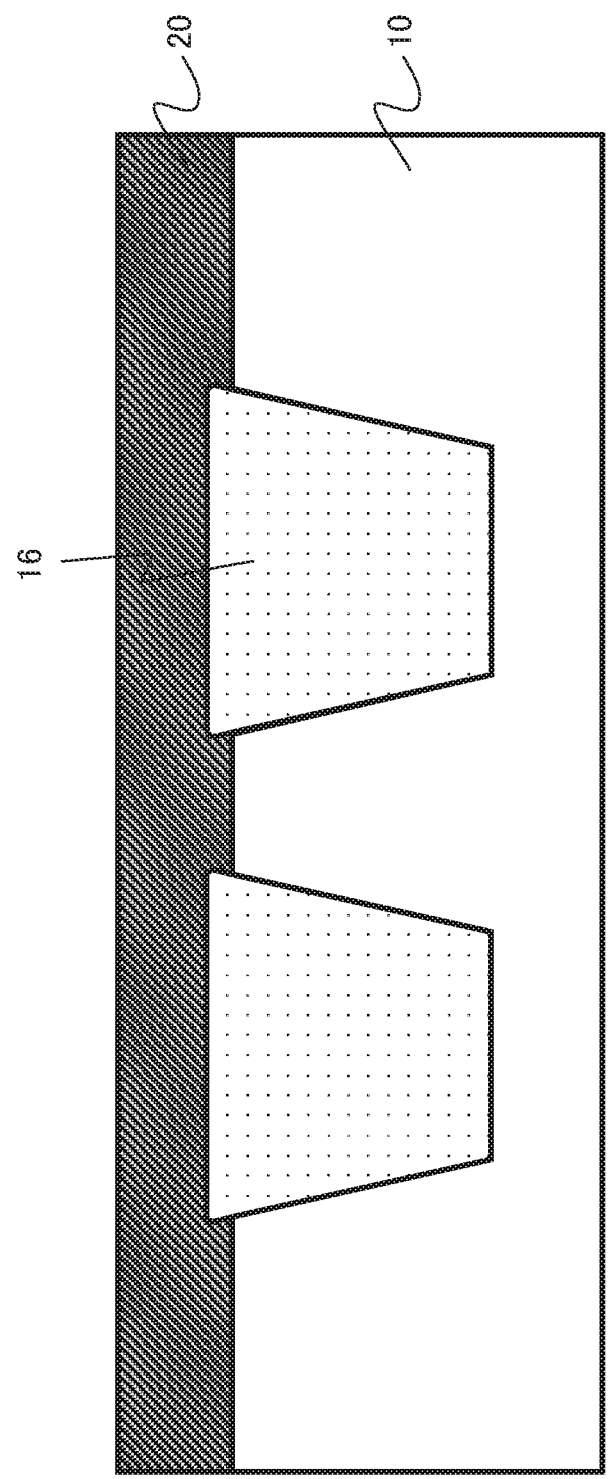
FIG. 14 is a cross-sectional view schematically illustrating the method for manufacturing a semiconductor device according to the comparative example.

Then, a gate insulating film (not illustrated) is formed on the single-crystal silicon substrate 10. Then, a gate electrode 20 is deposited (FIG. 14). The gate electrode 20 is deposited by, for example, the CVD method. The gate electrode 20 is made of a conductive material. The gate electrode 20 is made of a semiconductor, metal, or a metal compound.

Figure 15:
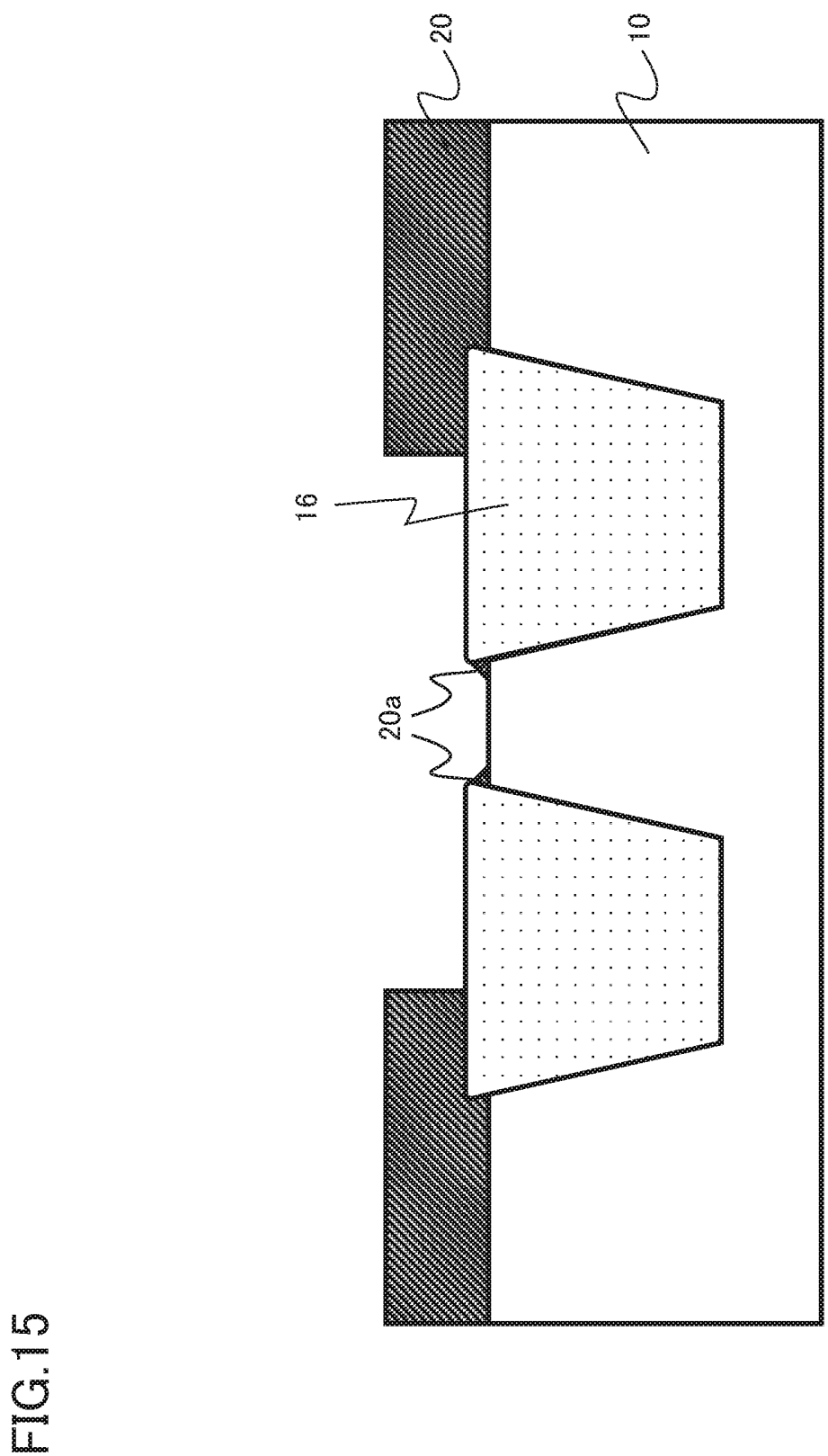
FIG. 15 is a cross-sectional view schematically illustrating the method for manufacturing a semiconductor device according to the comparative example.

Then, the gate electrode 20 is patterned (FIG. 15). The gate electrode 20 is patterned by, for example, the lithography method and the RIE method.

After the gate electrode 20 is patterned, the silicon oxide film 16 remains in an inverse tapered shape in an end portion of the STI structure. Therefore, an etching residue 20a of the gate electrode 20 is likely to be generated. In a case in which the etching residue 20a is generated, for example, a short circuit occurs between wires.

In the semiconductor device manufacturing method according to the first embodiment, after a portion of the silicon nitride film 12 is removed, a portion of the silicon oxide film 16 is removed by wet etching (FIGS. 5 and 6). Therefore, a corner portion of the silicon oxide film 16 exposed through the silicon nitride film 12 is etched by wet etching so as to be rounded. Finally, the silicon oxide film 16 with an inverse tapered shape does not remain in the end portion of the STI structure. Therefore, the etching residue 20a of the gate electrode 20 is less likely to remain in the end portion of the STI structure. As a result, a short circuit between the wires is prevented.

In a case in which a portion of the silicon nitride film 12 is removed, preferably, a portion of the silicon nitride film 12 that is equal to or greater than half of the thickness (t1 in FIG. 4) of the silicon nitride film 12 and is equal to or less than three quarters of the thickness remains. In a case in which the amount of residue is less than the above-mentioned range, the amount of etching of the silicon oxide film 16 in the end portion of the STI structure increases and there is a concern that the silicon oxide film 16 will be deeply recessed. In this case, there is a concern that the residue of the wire will remain in the recessed portion. In a case in which the amount of residue is more than the above-mentioned range, the film is likely to remain in an inverse tapered shape.

In a case in which a portion of the silicon oxide film 16 is removed by wet etching, it is preferable to adjust the wet etching such that the thickness (t3 in FIG. 6) of at least a portion of the silicon oxide film 16 remaining in the trench 14 is greater than the depth (d1 in FIG. 6) of the trench 14. In this case, it is possible to prevent the silicon oxide film 16 from being deeply recessed in the end portion of the STI structure. In addition, since a thick insulating film remains in the trench 14, it is possible to ensure a sufficient element isolation breakdown voltage.

As described above, according to the first embodiment, it is possible to achieve a semiconductor device manufacturing method that prevents the generation of an etching residue in an end portion of an STI structure.

Second Embodiment

A method for manufacturing a semiconductor device according to a second embodiment includes: forming a first insulating film on a semiconductor substrate, the first insulating film being patterned; forming a trench in the semiconductor substrate using the first insulating film as a mask; depositing a second insulating film in the trench and on the first insulating film; depositing a third insulating film on the second insulating film; removing the second insulating film and the third insulating film on the first insulating film using a CMP method; removing a portion of the second insulating film and a portion of the third insulating film using wet etching; and removing the first insulating film. An etching rate of the third insulating film during the wet etching is lower than a wet etching rate of the second insulating film.

The method for manufacturing a semiconductor device according to the second embodiment is a method for manufacturing a semiconductor device including an device isolation region with an STI structure.

FIG. 16, FIG. 17, FIG. 18, FIG. 19, FIG. 20, FIG. 21, FIG. 22, FIG. 23, FIG. 24, and FIG. 25 are cross-sectional views schematically illustrating the method for manufacture a semiconductor device according to the second embodiment.

First, a single-crystal silicon substrate 10 is prepared. The single-crystal silicon substrate 10 is an example of a semiconductor substrate.

Then, a silicon nitride film 12 is deposited on a surface of the single-crystal silicon substrate 10. The silicon nitride film 12 is an example of a first insulating film.

The silicon nitride film 12 is deposited by, for example, a CVD method. The thickness of the silicon nitride film 12 is, for example, equal to or greater than 100 nm and equal to or less than 1000 nm.

Figure 16:
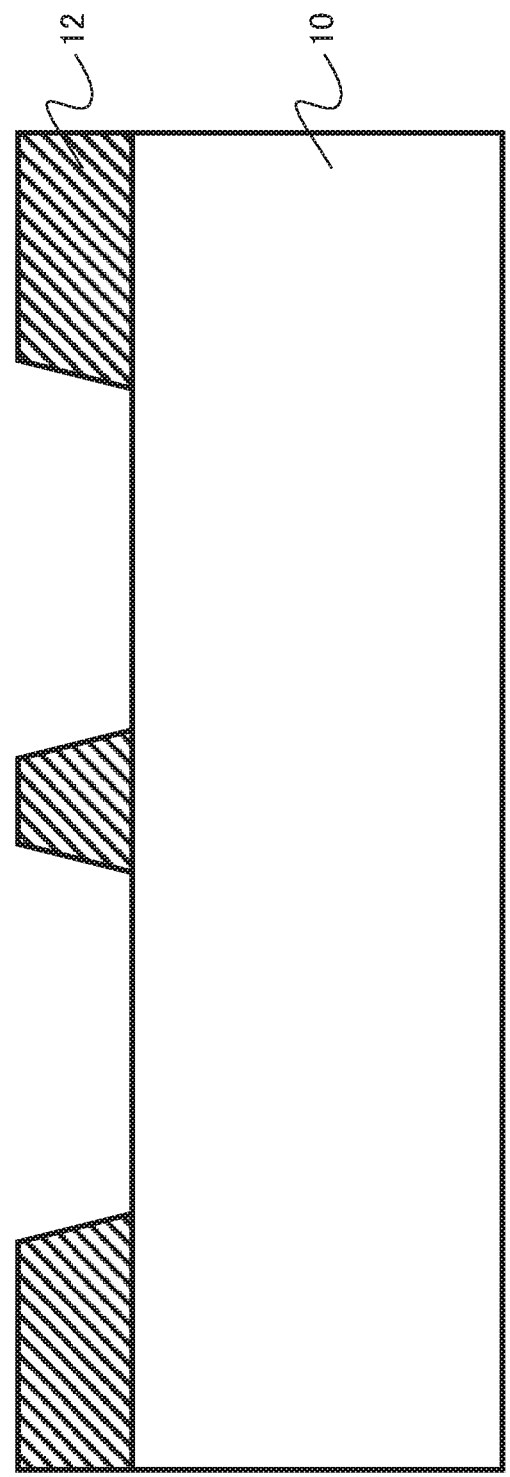
FIG. 16 is a cross-sectional view schematically illustrating a method for manufacturing a semiconductor device according to a second embodiment.

Then, the silicon nitride film 12 is patterned (FIG. 16). The silicon nitride film 12 is patterned by, for example, a lithography method and an RIE method.

Figure 17:
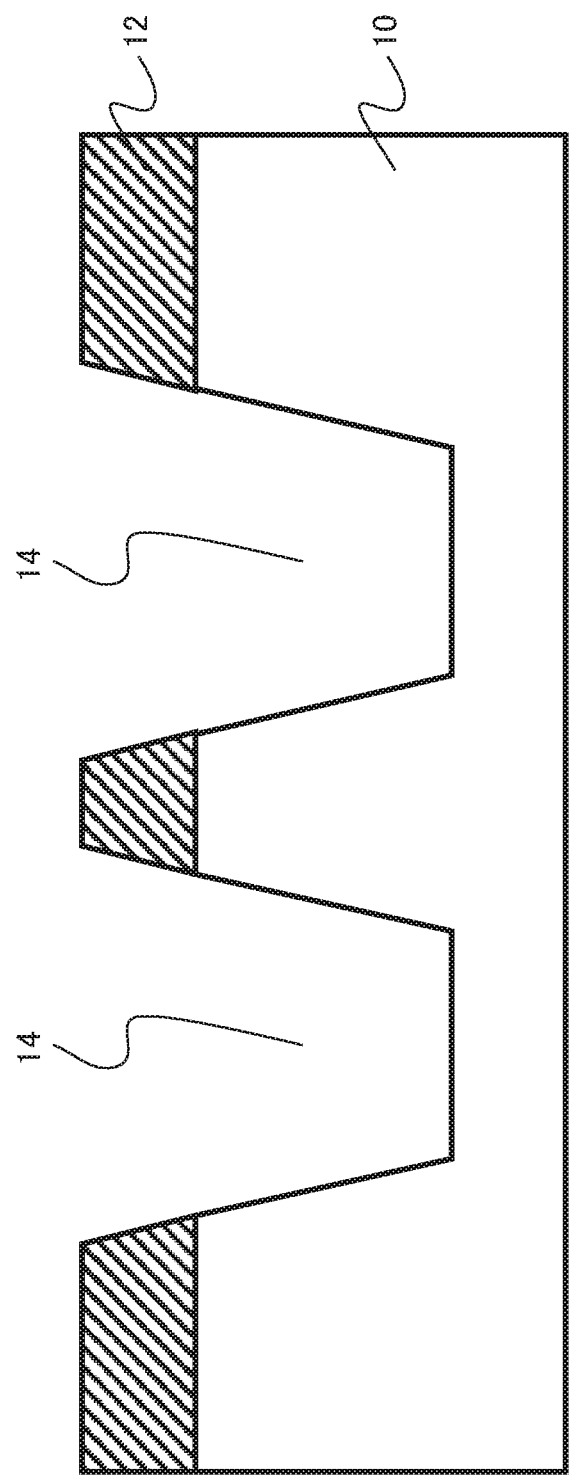
FIG. 17 is a cross-sectional view schematically illustrating the method for manufacturing a semiconductor device according to the second embodiment.

Then, a trench 14 is formed in the single-crystal silicon substrate 10 using the patterned silicon nitride film 12 as a mask (FIG. 17). The trench 14 is formed by, for example, the RIE method. The depth of the trench 14 is, for example, equal to or greater than 1 μm and equal to or less than 2 μm.

Figure 18:
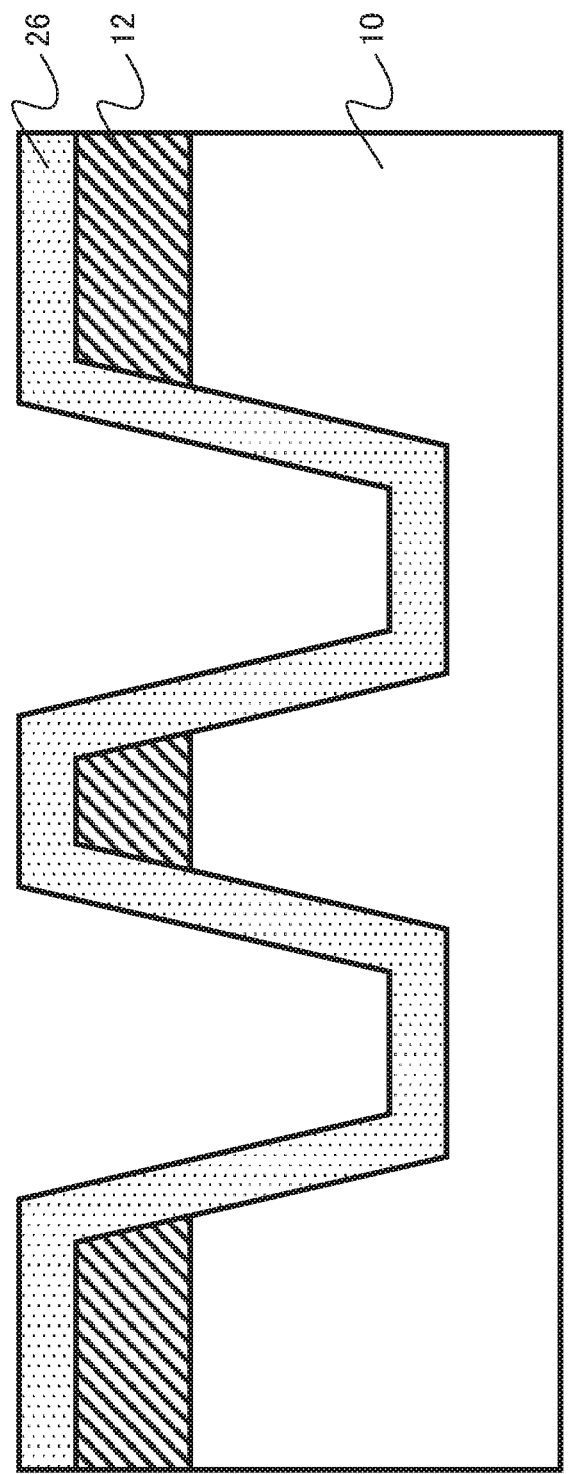
FIG. 18 is a cross-sectional view schematically illustrating the method for manufacturing a semiconductor device according to the second embodiment.

Then, a first silicon oxide film 26 is deposited in the trench 14 and on the silicon nitride film 12 (FIG. 18). The first silicon oxide film 26 is an example of a second insulating film. The first silicon oxide film 26 is deposited by, for example, an atmospheric pressure CVD method using tetraethoxysilane (TEOS) and ozone ($O_3$).

Figure 19:
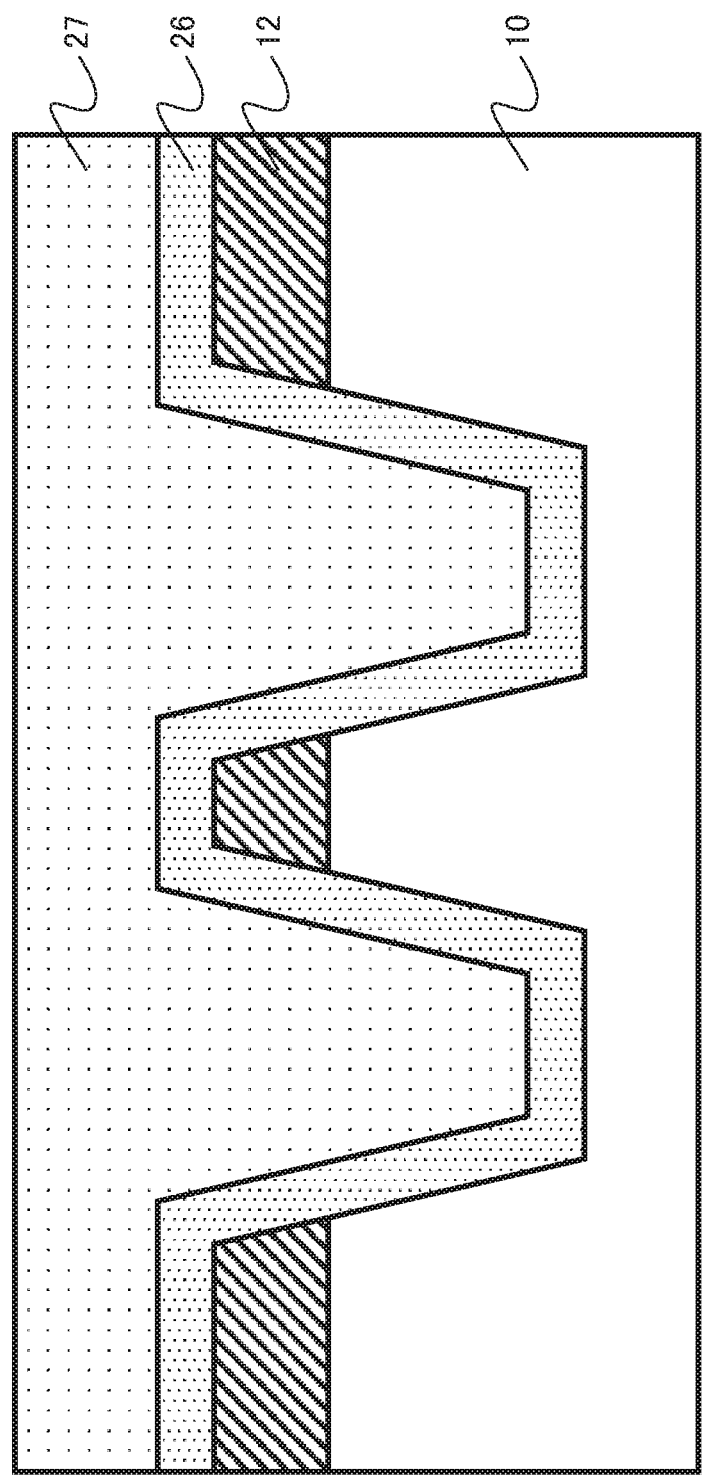
FIG. 19 is a cross-sectional view schematically illustrating the method for manufacturing a semiconductor device according to the second embodiment.

Then, a second silicon oxide film 27 is deposited in the trench 14 and on the first silicon oxide film 26 (FIG. 19). The second silicon oxide film 27 is an example of a third insulating film. A film whose etching rate during wet etching, which will be described below, is less than the wet etching rate of the first silicon oxide film 26 is selected as the second silicon oxide film 27.

The second silicon oxide film 27 is deposited by, for example, an HDP-CVD method. For example, the deposition thickness of the second silicon oxide film 27 is greater than the deposition thickness of the first silicon oxide film 26.

Figure 20:
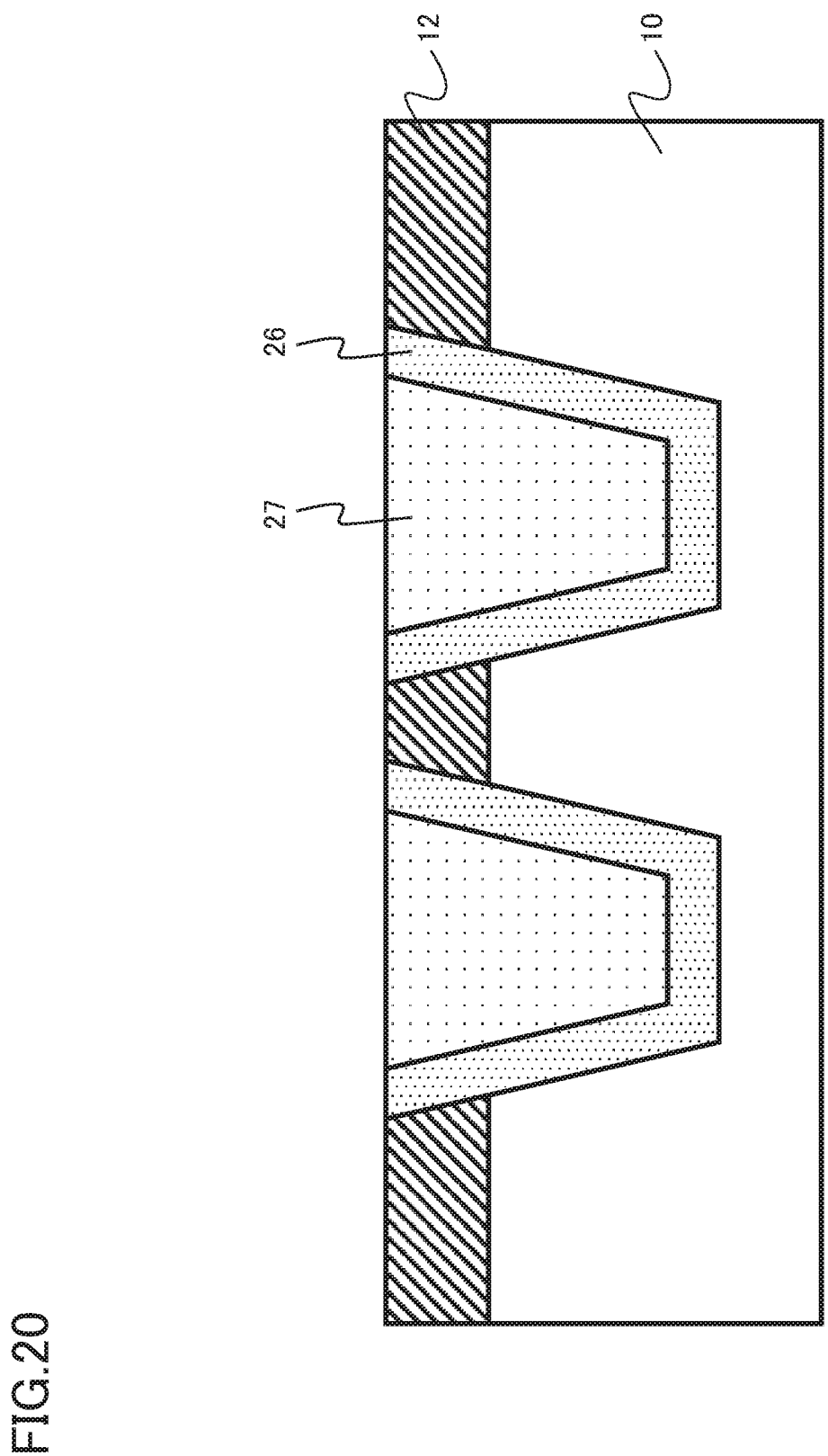
FIG. 20 is a cross-sectional view schematically illustrating the method for manufacturing a semiconductor device according to the second embodiment.

Then, the first silicon oxide film 26 and the second silicon oxide film 27 on the silicon nitride film 12 are removed by a CMP method (FIG. 20). The surfaces of the first silicon oxide film 26 and the second silicon oxide film 27 are planarized.

Then, an annealing process is performed. The first silicon oxide film 26 and the second silicon oxide film 27 are densified by the annealing process. For example, the annealing process is performed in an inert gas atmosphere at a temperature that is equal to or greater than 800° C. and equal to or less than 1200° C.

Figure 21:
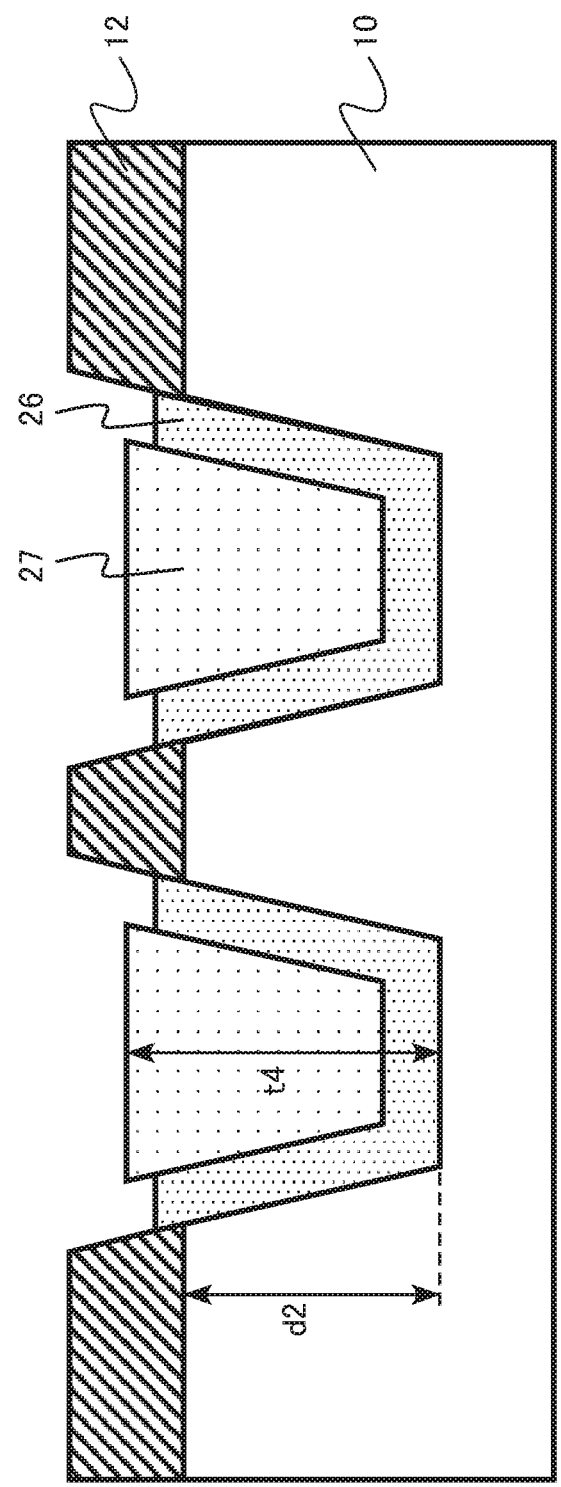
FIG. 21 is a cross-sectional view schematically illustrating the method for manufacturing a semiconductor device according to the second embodiment.

Then, portions of the first silicon oxide film 26 and the second silicon oxide film 27 are removed by wet etching (FIG. 21). Hydrofluoric-acid-based chemicals are used for the wet etching. For example, buffered hydrofluoric acid is used as the chemical. The buffered hydrofluoric acid is a mixed solution of hydrofluoric acid and ammonium fluoride.

The wet etching rate of the second silicon oxide film 27 is lower than the wet etching rate of the first silicon oxide film 26. In other words, the wet etching rate of the first silicon oxide film 26 is higher than the wet etching rate of the second silicon oxide film 27. Therefore, the amount, of etching of the first silicon oxide film 26 is more than the amount of etching of the second silicon oxide film 27.

For example, the wet etching is adjusted such that the thickness (t4 in FIG. 21) of at least portions of the first silicon oxide film 26 and the second silicon oxide film 27 remaining in the trench 14 is greater than the depth (d2 in FIG. 21) of the trench 14.

Figure 22:
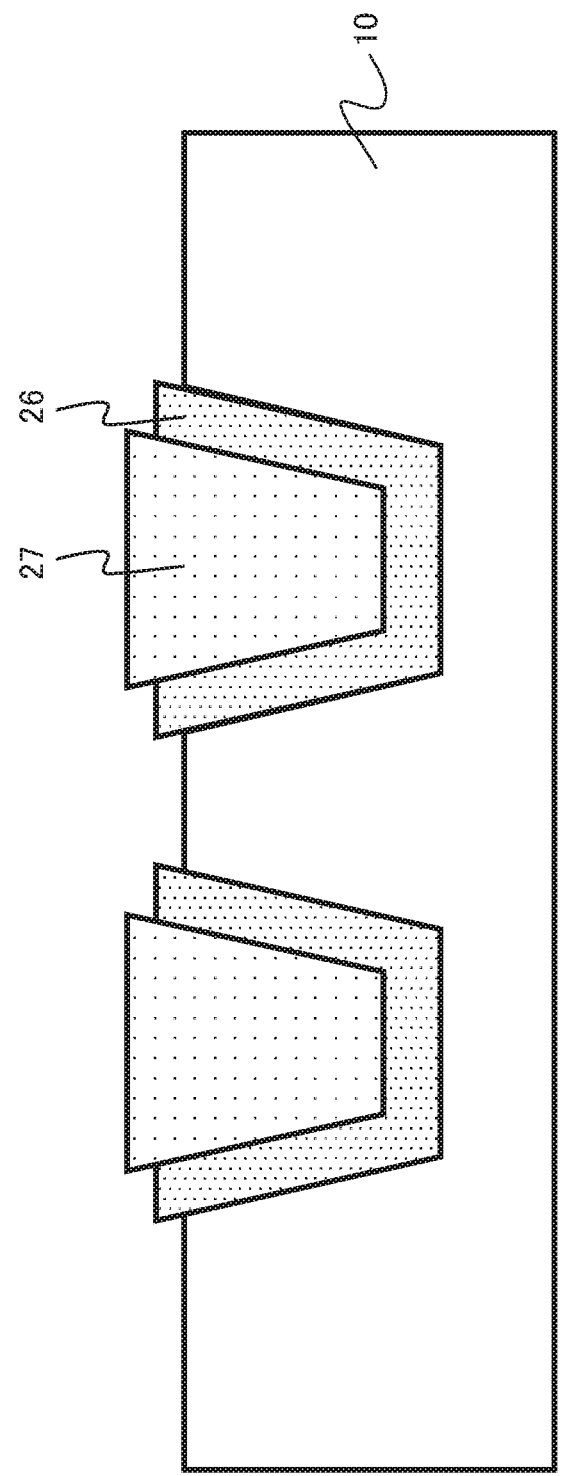
FIG. 22 is a cross-sectional view schematically illustrating the method for manufacturing a semiconductor device according to the second embodiment.

Then, the silicon nitride film 12 is removed (FIG. 22). The silicon nitride film 12 is etched by, for example, wet etching. For example, thermal phosphoric acid is used for the wet etching.

Figure 23:
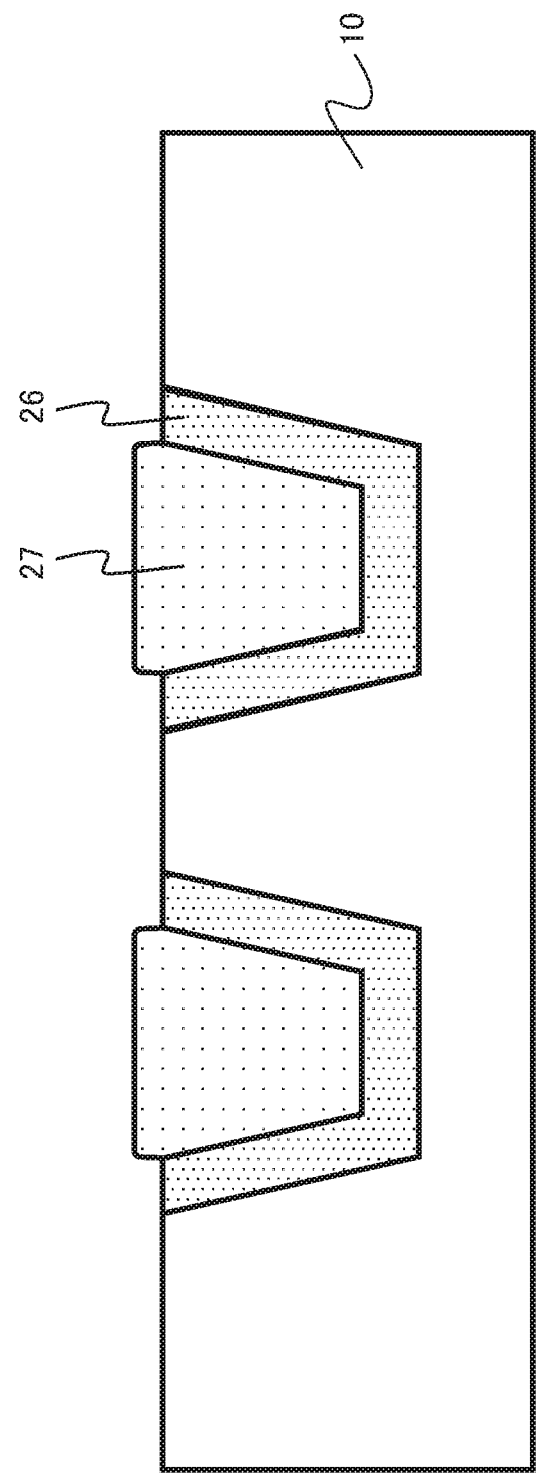
FIG. 23 is a cross-sectional view schematically illustrating the method for manufacturing a semiconductor device according to the second embodiment.

Then, pre-processing for forming a gate oxide film is performed (FIG. 23). The pre-processing is performed by wet etching. Hydrofluoric-acid-based chemicals are used for the wet etching. For example, diluted hydrofluoric acid is used as the chemical. Portions of the first silicon oxide film 26 and the second silicon oxide film 27 are etched by the pre-processing.

Figure 24:
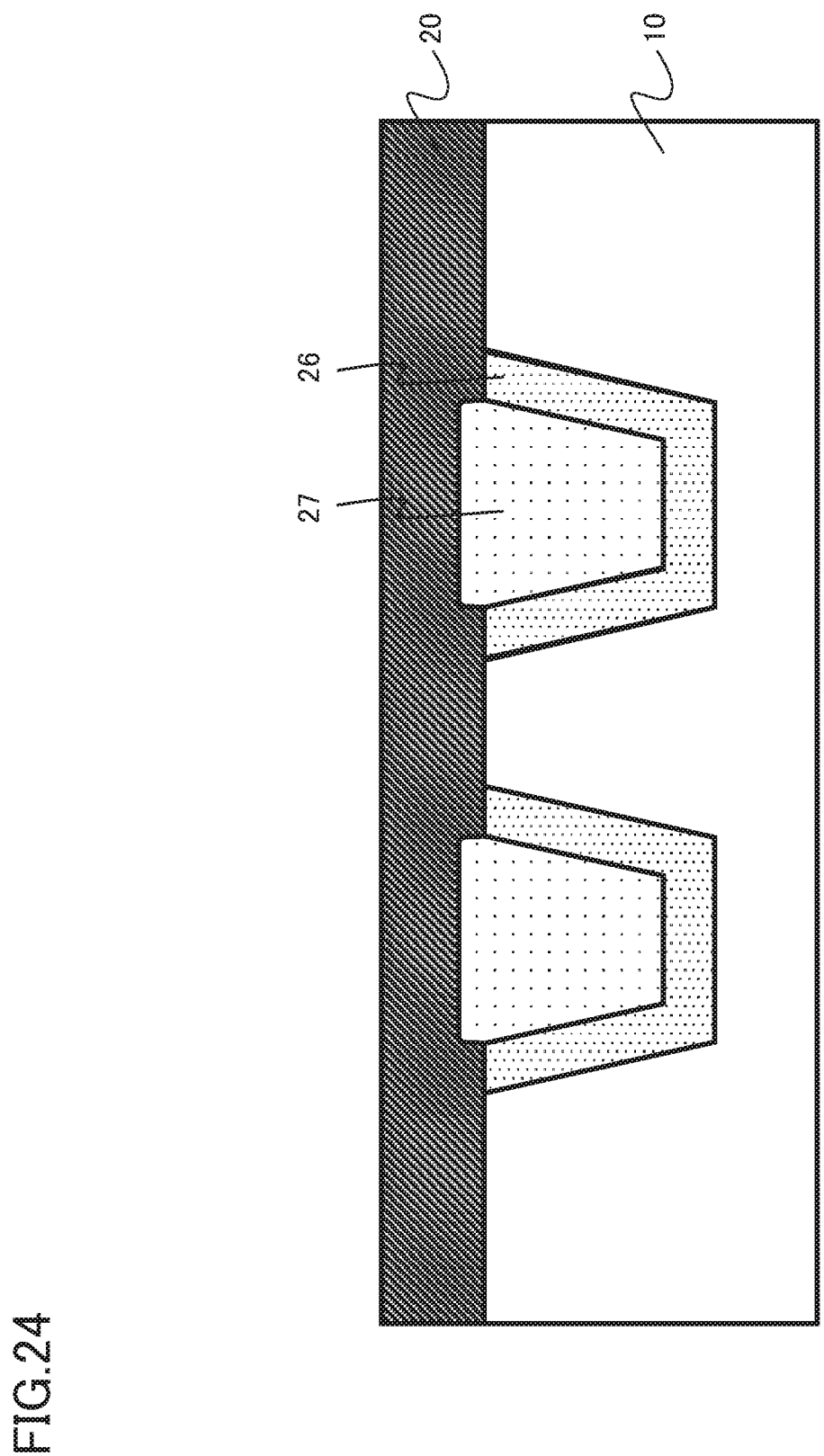
FIG. 24 is a cross-sectional view schematically illustrating the method for manufacturing a semiconductor device according to the second embodiment.

Then, a gate insulating film (not illustrated) is formed on the single-crystal silicon substrate 10. Then, a gate electrode 20 is deposited (FIG. 24). The gate electrode 20 is deposited by, for example, a CVD method. The gate electrode 20 is made of a conductive material. The gate electrode 20 is made of a semiconductor, metal, or a metal compound.

Figure 25:
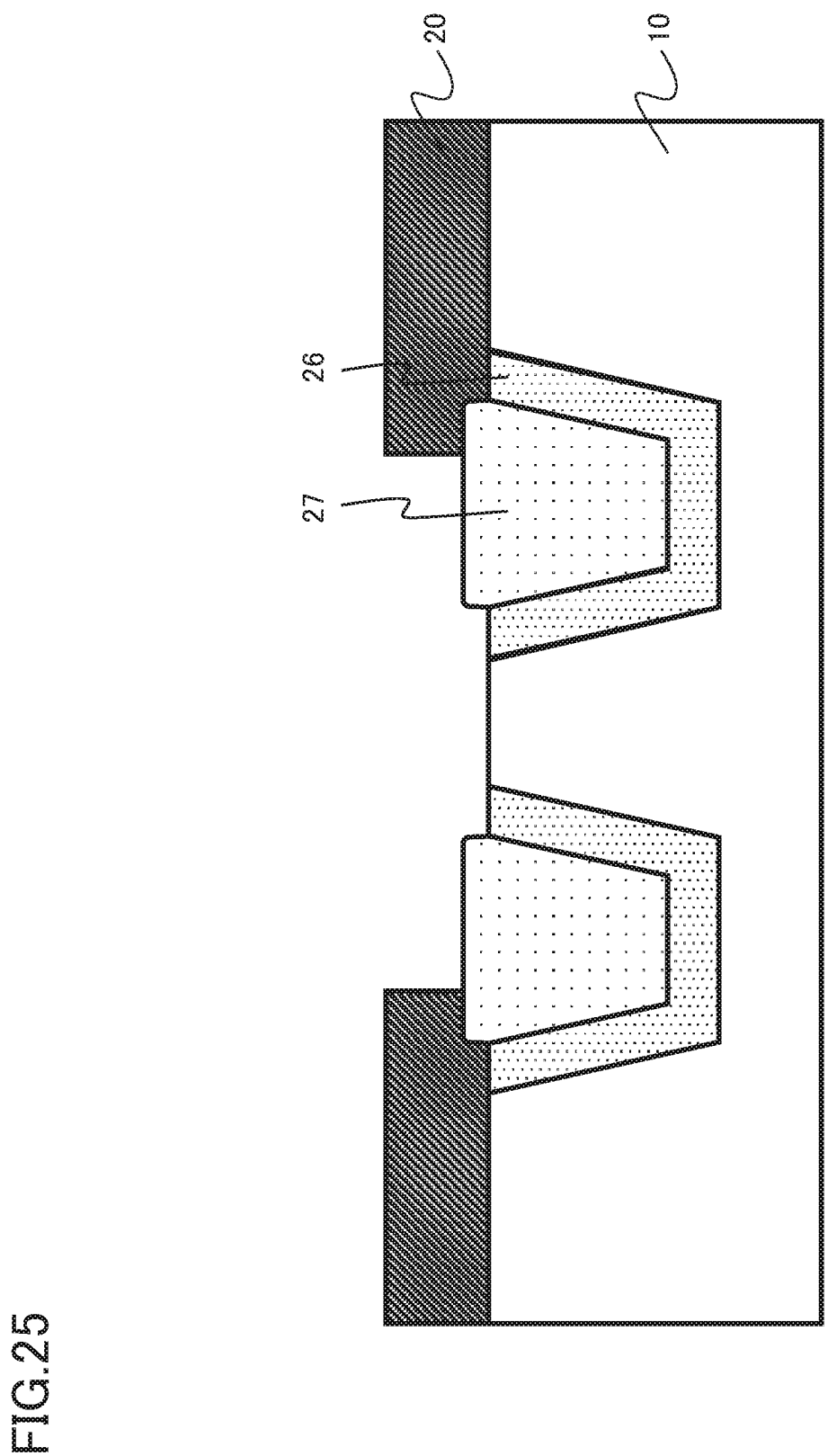
FIG. 25 is a cross-sectional view schematically illustrating the method for manufacturing a semiconductor device according to the second embodiment.

Then, the gate electrode 20 is patterned (FIG. 25). The gate electrode 20 is patterned by, for example, a lithography method and an RIE method.

The semiconductor device in which the gate electrode 20 has been patterned on the STI structure is manufactured by the above-mentioned manufacturing method.

Next, the function and effect of the second embodiment will be described.

In the semiconductor device manufacturing method according to the second embodiment, the trench 14 is filled with two types of insulating films with different wet etching rates. Specifically, the trench 14 is filled with the first silicon oxide film 26 with a high wet etching rate and the second silicon oxide film 27 with a low wet etching rate.

The first silicon oxide film 26 with a high wet etching rate is located in an end portion of the STI structure. Therefore, in a case in which portions of the first silicon oxide film 26 and the second silicon oxide film 27 are removed by wet etching, the amount of etching of the first silicon oxide film 26 in the end portion of the STI structure is more than the amount of etching of the second silicon oxide film 27. As a result, the silicon oxide film with an inverse tapered shape does not remain in the end portion of the STI structure. Therefore, an etching residue of the gate electrode 20 is less likely to remain in the end portion of the STI structure. A short circuit between the wires is prevented.

In a case in which portions of the first silicon oxide film 26 and second silicon oxide film 27 are removed by wet etching, it is preferable to adjust the wet etching such that the thickness (14 in FIG. 21) of at least portions of the first silicon oxide film 26 and second silicon oxide film 27 remaining in the trench 14 is greater than the depth (d2 in FIG. 21) of the trench 14. In this way, it is possible to prevent the silicon oxide film from being deeply recessed in the end portion of the STI structure. In addition, since a thick insulating film remains in the trench 14, it is possible to ensure a sufficient element isolation breakdown voltage.

For example, it is preferable that the deposition thickness of the second silicon oxide film 27 be greater than the deposition thickness of the first silicon oxide film 26. In this case, it is possible to prevent the silicon oxide film from being deeply recessed in the end portion of the STI structure. In addition, since a thick insulating film remains in the trench 14, it is possible to ensure a sufficient element isolation breakdown voltage.

As described above, according to the second embodiment, it is possible to achieve a semiconductor device manufacturing method that prevents the generation of an etching residue in an end portion of an STI structure.

In the first and second embodiments, wet etching has been described as an example of the isotropic etching. However, isotropic dry etching may be used as the isotropic etching.

In the first and second embodiments, the case in which the annealing process for densifying the silicon oxide film is performed after the silicon oxide film is planarized and before wet etching is performed for the silicon oxide film has been described as an example. However, the annealing process may be performed, for example, before the silicon oxide film is planarized. In addition, the annealing process may be omitted.

In the second embodiment, a combination of the silicon oxide film deposited by the atmospheric pressure CVD method using tetraethoxysilane (TEOS) and ozone ($O_3$) and the silicon oxide film deposited by the HDP-CVD method has been described as an example of the second insulating film and the third insulating film. However, combinations of other insulating films may be selected as long as there is a difference between the wet etching rates of the insulating films.

While certain embodiments have been described, these embodiments have been presented by way of example only, and are not intended to limit the scope of the inventions. Indeed, method for manufacturing a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    forming a first insulating film on a semiconductor substrate, the first insulating film being patterned;
    forming a trench in the semiconductor substrate using the first insulating film as a mask;
    depositing a second insulating film in the trench and on the first insulating film;
    depositing a third insulating film on the second insulating film;
    removing the second insulating film and the third insulating film on the first insulating film using a CMP method;
    removing a portion of the second insulating film and a portion of the third insulating film using isotropic etching; and removing the first insulating film, wherein an etching rate of the third insulating film during the isotropic etching is lower than an etching rate of the second insulating film.

2. The method for manufacturing a semiconductor device according to claim 1, wherein a deposition thickness of the third insulating film is greater than a deposition thickness of the second insulating film.

3. The method for manufacturing a semiconductor device according to claim 1, wherein, in the removing the portion of the second insulating film and the portion of the third insulating film by the isotropic etching, a thickness of at least portions of the second insulating film and the third insulating film remaining in the trench is greater than a depth of the trench.

4. The method for manufacturing a semiconductor device according to claim 1, wherein the first insulating film is made of silicon nitride and the second insulating film and the third insulating film are made of silicon oxide.

* * * * *